(12) United States Patent
Hou et al.

(10) Patent No.: US 7,247,894 B2
(45) Date of Patent: Jul. 24, 2007

(54) VERY FINE-GRAIN VOLTAGE ISLAND INTEGRATED CIRCUIT

(75) Inventors: Cliff Hou, Taipei (TW); Li-Chun Tien, Tainan (TW); Ching-Hao Shaw, Plano, TX (US); Wan-Pin Yu, San Jose, CA (US); Chia-Lin Cheng, Tao-Yuan (TW); Lee-Chung Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 386 days.

(21) Appl. No.: 11/029,267

(22) Filed: Jan. 5, 2005

(65) Prior Publication Data

US 2005/0242375 A1    Nov. 3, 2005

Related U.S. Application Data

(60) Provisional application No. 60/566,041, filed on Apr. 28, 2004.

(51) Int. Cl.
*H01L 27/10* (2006.01)
*H01L 23/48* (2006.01)
*H01L 23/52* (2006.01)
*H01L 29/40* (2006.01)

(52) U.S. Cl. ............... 257/211; 257/207; 257/758
(58) Field of Classification Search .......... 257/22–211, 257/758

See application file for complete search history.

(56) References Cited

U.S. PATENT DOCUMENTS 5,965,922 A * 10/1999 Matsui .................. 257/369
7,023,058 B2 * 4/2006 Kanno et al. .......... 257/758

OTHER PUBLICATIONS

Kakerow, R., "Low Power Design Methodologies for Mobile Communication," Proceedings of the 2002 IEEE International Conference on Computer Design: VLSI Computers and Processors, 2002, pp. 1-6.
Puri, R., et al., "Pushing ASIC Performance in a Power Envelope," DAC, Jun. 2-6, 2003, Anaheim, CA, pp. 788-793.
Usami, K., et al., "Low-power Design Methodology and Applications utilizing Dual Supply Voltages," Proceedings of the Design Automation Conference, IEEE, Jan. 2000, pp. 123-128.

* cited by examiner

*Primary Examiner*—Cuong Nguyen
(74) *Attorney, Agent, or Firm*—Slater & Matsil, L.L.P.

(57) ABSTRACT

Methods of supplying voltages to integrated circuits are provided. A high voltage VddH and/or a low voltage VddL can be supplied to a filler cell and routed to other cells. Each of the VddH and VddL is carried by one of a first voltage supply wire and a second voltage supply wire. A voltage routing wire routes desired voltage(s) to a filler cell. The first and the second voltage supply wires are preferably formed parallel to the voltage routing wire with their edges substantially aligned to the edges of the voltage routing wire. Vias are made to route the desire voltage. Also preferably, the first voltage supply wire is an M1 wire formed outside the filler cell while the second voltage supply wire is an M2 wire formed inside the filler cell.

18 Claims, 5 Drawing Sheets

VERY FINE-GRAIN VOLTAGE ISLAND INTEGRATED CIRCUIT

This application claims the benefit of U.S. Provisional Application No. 60/566,041, filed on Apr. 28, 2004, entitled "Very Fine-Grain Voltage Island Integrated Circuit", which application is hereby incorporated herein by reference.

CROSS-REFERENCE TO RELATED APPLICATIONS

This application relates to the following co-pending and commonly assigned patent application: Application Ser. No. 10/868,606, filed Jun. 15, 2004, entitled "Variable Layout Design for Multiple Voltage Applications"; which application is incorporated herein by reference.

TECHNICAL FIELD

The present invention relates generally to methods for supplying voltages to integrated circuits, and more particularly to very fine-grain voltage supply schemes.

BACKGROUND

The rising popularity of electronic devices such as mobile applications has created a need for power conservation in integrated circuits. A semiconductor integrated circuit may comprise circuits demanding high operation voltages and circuits that allow for low operation voltages. For example, a core circuit may need only 1.0V operation voltage, while an I/O circuit may need 3.3V operation voltage. Typically, a circuit consumes higher power with a high operation voltage. However, early generations of integrated circuits only have the ability to provide one voltage supply to a large region, such as a design block. Some circuits have to share high operation voltage with other circuits even though they only need low voltage supply. Therefore, more power is consumed.

Several prior art documents were discussed in U.S. patent application Ser. No. 10/868,606, which application is incorporated by reference. Based on the ability to provide voltages, these prior art designs range from coarse-grain, where each design block shares a voltage, to fine-grain, where each row can have a high voltage (VddH) and/or a low voltage (VddL) as voltage supplies, to very fine-grain, where each cell in a row can have a VddH and/or a VddL. VddH and VddL are high or low voltages relative to each other, respectively, and the voltage levels are determined by specific design requirements.

SUMMARY OF THE INVENTION

The preferred embodiment of the present invention presents methods of supplying voltages to integrated circuits. Two voltages, namely a high voltage VddH and a low voltage VddL can be supplied to a filler cell and be routed to other cells. Each of the VddH and VddL is carried by either the first voltage supply wire or the second voltage supply wire. Voltage routing wires route the desired voltages to the filler cell.

In accordance with one aspect of the present invention, an integrated circuit structure comprises a filler cell having an n-well. A first voltage supply wire and a second voltage supply wire are formed in a metal layer selected from the group consisting of metal layer 2 and metal layer 3. The first and the second voltage supply wires are substantially parallel and have a space substantially equal to the wire width of a voltage routing wire. The first and second voltage supply wires each have an edge substantially aligned with an edge of the voltage routing wire. If the voltage carried by the first voltage supply wire is desired by the filler cell, vias are formed preferably having one half of each via connecting the voltage routing wire and the other half connecting the first voltage supply wire. Similarly, if the voltage carried by the second voltage supply wire is desired by the filler cell, vias are preferably formed having one half of each via connecting the voltage routing wire and the other half connecting the second voltage supply wire.

In accordance with another aspect of the present invention, the first voltage supply wire is formed in metal layer 1 and outside the filler cell, and the second voltage supply wire is formed in metal layer 2 within the filler cell. If the voltage carried by the first voltage supply wire is desired by the filler cell, the voltage routing wire is shorted with the first voltage supply wire. If the voltage carried by the second voltage supply wire is desired by the filler cell, vias are formed connecting the voltage routing wire and the second voltage supply wire.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Throughout the description, like reference numbers are used to designate like elements throughout the various views and illustrative embodiments of the present invention. When a wire is described as within or outside a cell, a top view is preferred. Physically, the wire is in a metal layer above doped wells and devices formed in the wells.

Figure 1:
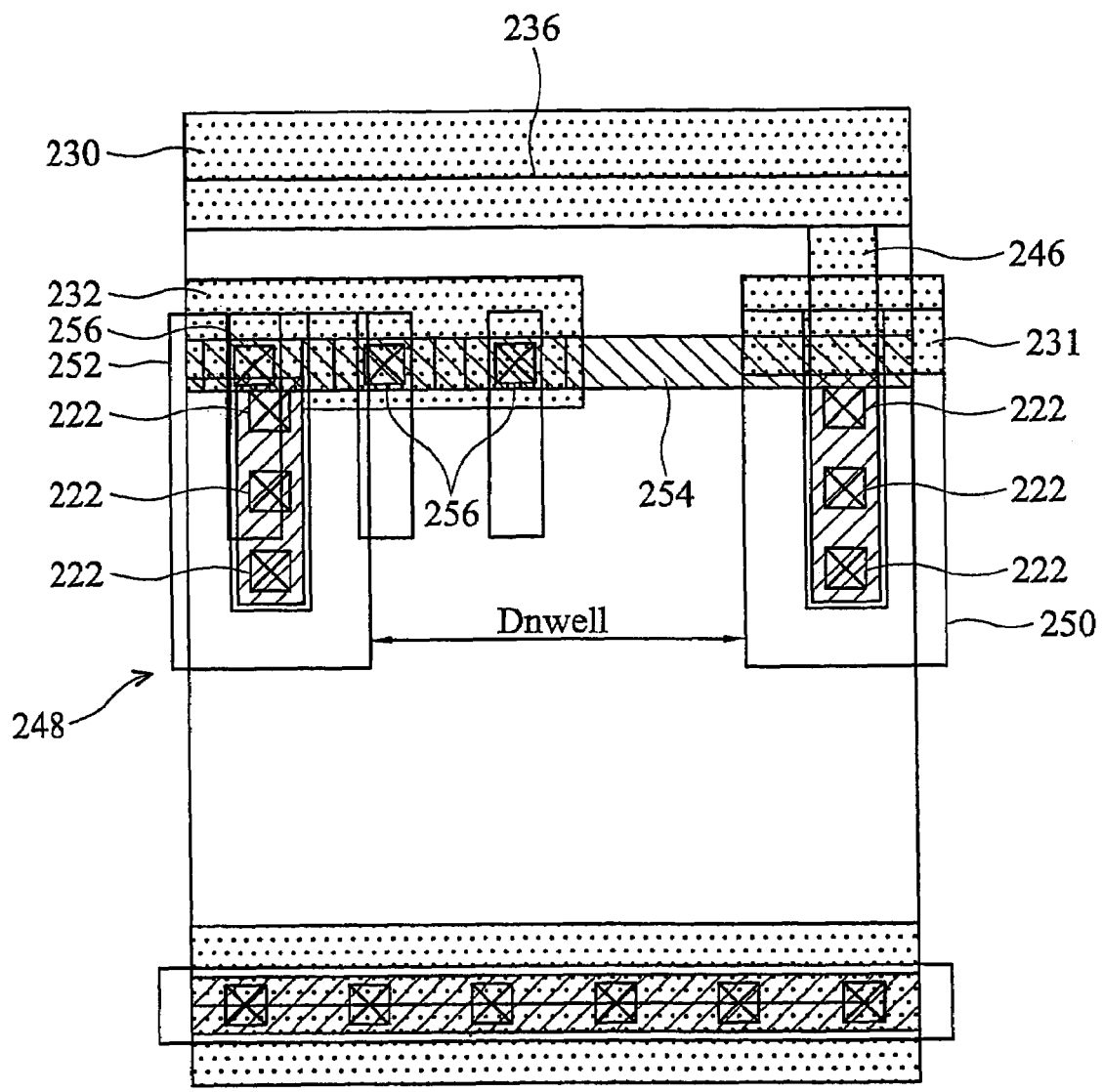
FIG. 1 illustrates a filler cell having a very fine-grain voltage supply scheme.

FIG. 1 illustrates a voltage supply scheme proposed by commonly assigned co-pending patent application Ser. No. 10/868,606. Filler cells are formed with the function of receiving desired voltage(s) and routing the voltages to neighboring cells. A dual-voltage supply is provided to the filler cell through two voltage supply wires, each carrying one voltage. The first voltage supply wire is in metal layer 1 (M1) and outside the filler cell (i.e. outside the boundary of the cell). The second one is inside the filler cell and in metal layer 3 (M3). A voltage routing wire is placed in M1 and routes the desired voltage supply to the devices and n-wells in the filler cell. The detailed description of FIG. 1 is as follows. A filler cell 248 has two n-well regions 250 and 252. A voltage supply wire 230, which provides a voltage $V_{first}$ to the cell 248, is placed in metal layer 1 (M1) and outside the filler cell 248. It preferably stretches from left to right and provides voltage to multiple cells that are parallel to the cell 248. A metal layer 3 (M3) voltage supply wire 254, which provides a power voltage $V_{second}$, is placed in the filler cell 248 and also stretches from left to right. $V_{first}$ and $V_{second}$ are typically at different voltage levels, such as one is VddH and the other is VddL. Voltage supply wire 254 is above the cell 248 and preferably above n-wells 250 and 252. Vias 256 connect voltage supply wire 254 to metal layer 2 (M2), and then to M1 voltage routing wire 232. N-well 252 and devices formed in n-well 252 obtain a voltage supply from the voltage routing wire 232. Also, the n-well 250 may obtain a voltage supply from an M1 voltage routing wire 231, which is formed above the n-well 250 and shorted to M1 voltage supply wire 230. Therefore, VddH and/or VddL may be provided to each cell based on its needs.

Voltage routing wire 232 may connect to another voltage routing wire in a cell on the left of the filler cell 248, and voltage routing wire 231 may also connect to another voltage routing wire in a cell on the right of the filler cell 248. Therefore, filler cell 248 acts as a voltage routing cell. Filler cell 248 may also comprise only one n-well, such as 250 or 252, and thus it only accepts voltage from either the M1 voltage supply wire 230 or the M3 voltage supply wire 254.

Figure 2:
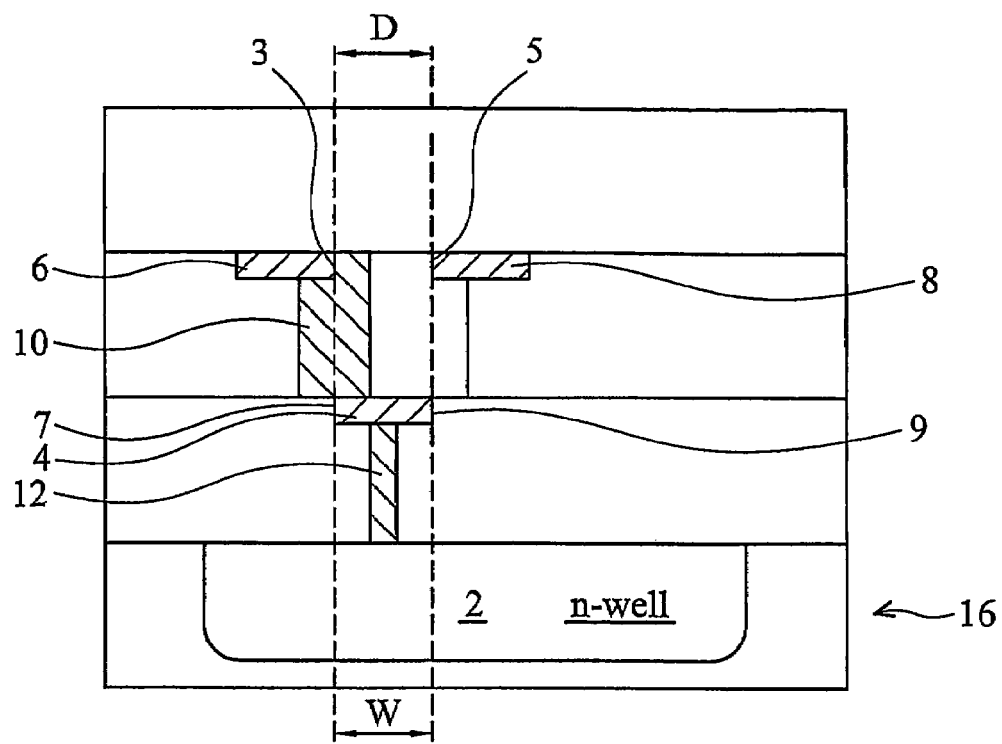
FIGS. 2 and 3 illustrate cross sectional views of a preferred embodiment of the present invention.

FIG. 2 illustrates a cross sectional view of the preferred embodiment of the present invention. It is assumed that two voltages, a lower voltage VddL and/or a higher voltage VddH, are needed by a filler cell 16. It is further assumed that the higher voltage VddH is carried by a voltage supply wire 6, and the lower voltage VddL is carried by a voltage supply wire 8. Both voltage supply wires 6 and 8 can either be in metal layer 2 (M2) or metal layer 3 (M3). A voltage routing wire 4 is in metal layer 1 and routes the desired voltage from either voltage supply wire 6 or 8 to devices and n-wells in the filler cell 16. In the preferred embodiment, the voltage supply wires 6 and 8 have a horizontal separation distance D that is the same as the width W of the voltage routing wire 4. The edges 3 and 5 of the voltage routing wire 4 are aligned with the edges 7 and 9 of the voltage supply wires 6 and 8, respectively. In other embodiments, the edges of the voltage supply wires 6 and 8 are somewhat misaligned with the edges of the voltage routing wire 4. The misalignment is preferably smaller than about the minimum space between two voltage supply wires (M2 or M3) of the integrated circuit at the same metallization level. Preferably, the misalignment is smaller than about 70% of the width W of the voltage routing wire 4. More preferably, the misalignment is smaller than about 50% of the width W of the voltage routing wire 4. Also, the distance D is preferably smaller than about 70% of the width W.

In FIG. 2, voltage routing wire 4 is connected to the voltage supply wire 6 through via(s) 10, and is connected to an n-well 2 through via 12. While only a single via 10 and single via 12 is illustrated, one skilled in the art will recognize that multiple vias may be used. The voltage carried by the M2 voltage supply wire 6 is thus supplied to circuits in the n-well 2. One edge of the voltage supply wire 6 is substantially aligned an edge of the voltage supply wire 6, and each of the vias 10 has a portion, preferably one half overlapping the voltage supply wire 6 and the other half overlapping the voltage routing wire 4. Although the via 10 can only carry smaller current due to reduced contact area with the voltage supply wire 6 and 8, the lost current carrying ability can be compensated for by doubling the number of vias 10. Similarly, if VddL is needed by the devices in the n-well 2, vias can be formed connecting voltage routing wire 4 and voltage supply wire 8 instead of voltage supply wire 6.

Figure 3:
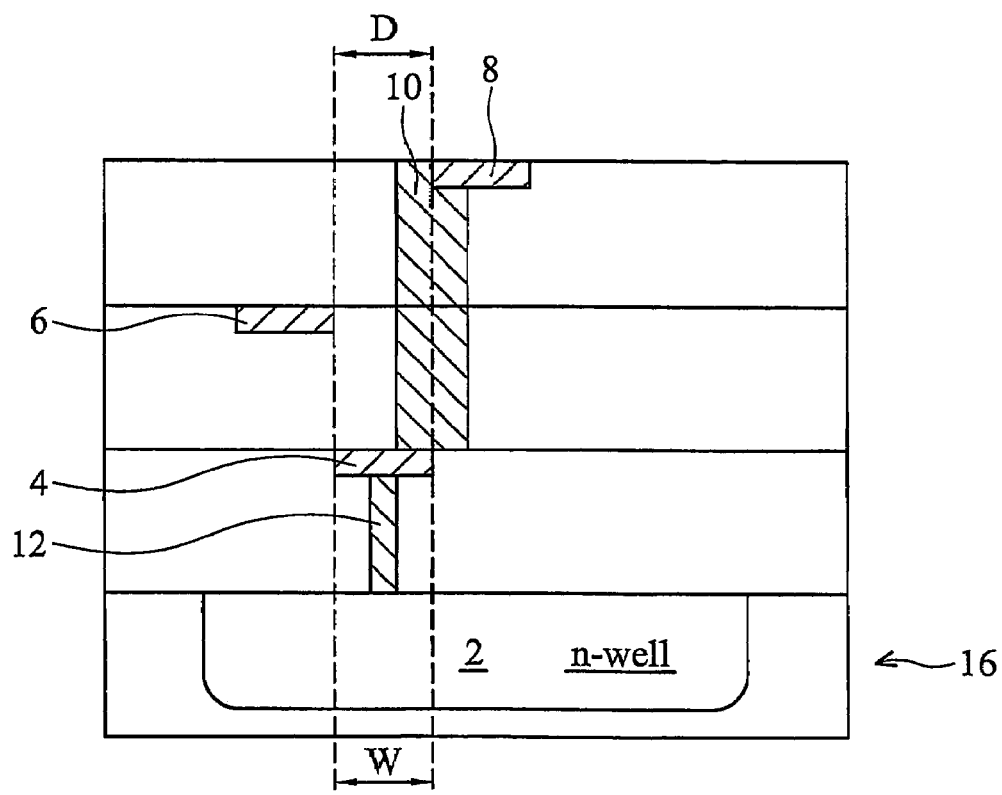

FIG. 3 illustrates a variation of the preferred embodiment. One of the voltage supply wires, for example, wire 6, is formed in M2, while the other voltage supply wire 8 is formed in M3. When the voltage carried by the voltage supply wire 8 is needed by the n-well 2 and the devices in it, vias 10 are formed connecting voltage supply wire 8 and voltage routing wire 4.

In yet another variation of the preferred embodiment, both voltage supply wires 6 and 8 are formed in metal layer 3. Whether to form the voltage supply wires 6 and 8 in M2 or M3 may be determined by factors such as space availability, cost, etc.

Figure 4:
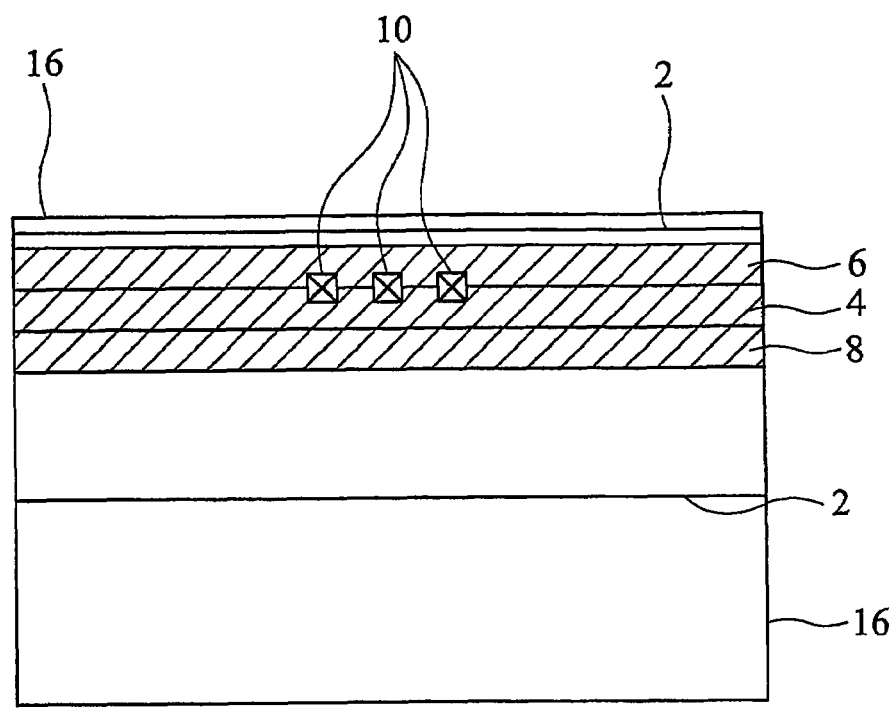
FIG. 4 illustrates a top view of the preferred embodiment shown in FIGS. 2 and 3.

FIG. 4 illustrates a top view of the preferred embodiment. In the preferred embodiment, the voltage supply wires 6 and 8 appear to be joined by the voltage routing wire 4 although they are actually in different layers.

Figure 5:
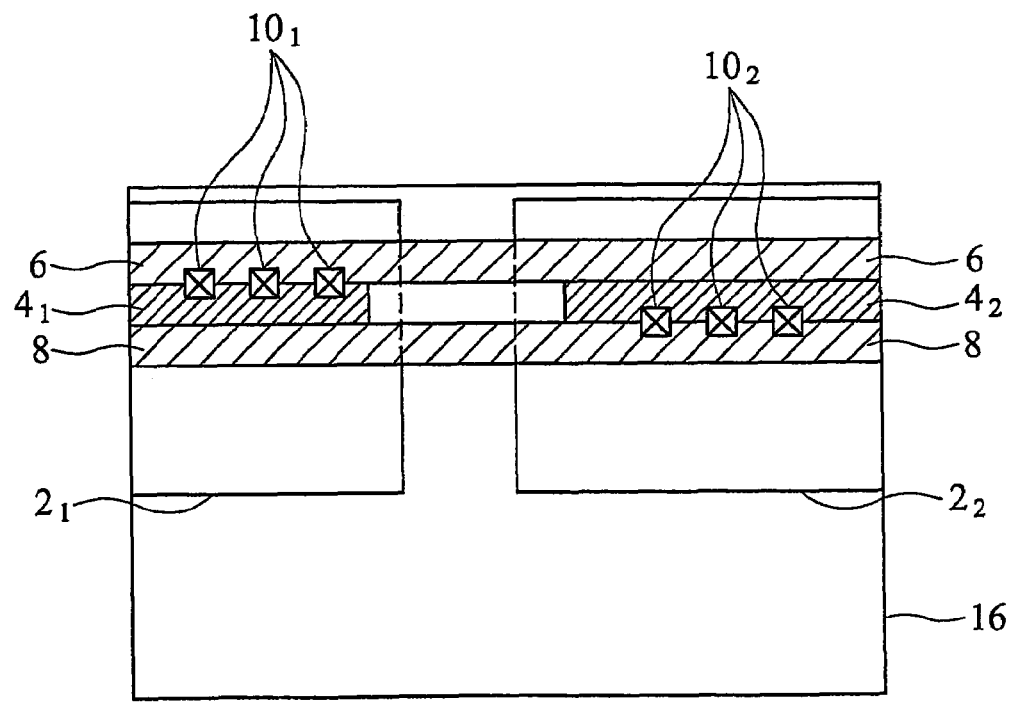
FIG. 5 illustrates a top view of the preferred embodiment of the present invention, wherein both VddH and VddL are supplied to a filler cell.

FIG. 5 illustrates a top view of another variation of the present embodiment of the present invention where two voltages are supplied to a filler cell 16. Two n-wells $2_1$ and $2_2$ are formed in the filler cell 16. The voltage routing wire 4 is separated into two parts, namely $4_1$ and $4_2$, by a gap. Voltage routing wire $4_1$ is connected to the voltage supply wire 6 through vias $10_1$, so that it is supplied with VddH. It can also conduct VddH to the n-well $2_1$ if desired. On the other hand, voltage routing wire $4_2$ is connected to the voltage supply wire 8 through vias $10_2$, so that it is supplied with VddL. It can also conduct VddL to the n-well $2_2$ if desired. Voltage supply wires 6 and 8 may preferably be extended out of the filler cell 16 and above multiple cells that are parallel so that VddH and VddL can be supplied to those cells directly. Alternatively, VddH and VddL can be supplied through the filler cell 16. Voltage routing wire $4_1$ routes VddH to cells on the left, and voltage routing wire $4_2$ routes VddL to cells on the right.

Figure 6:
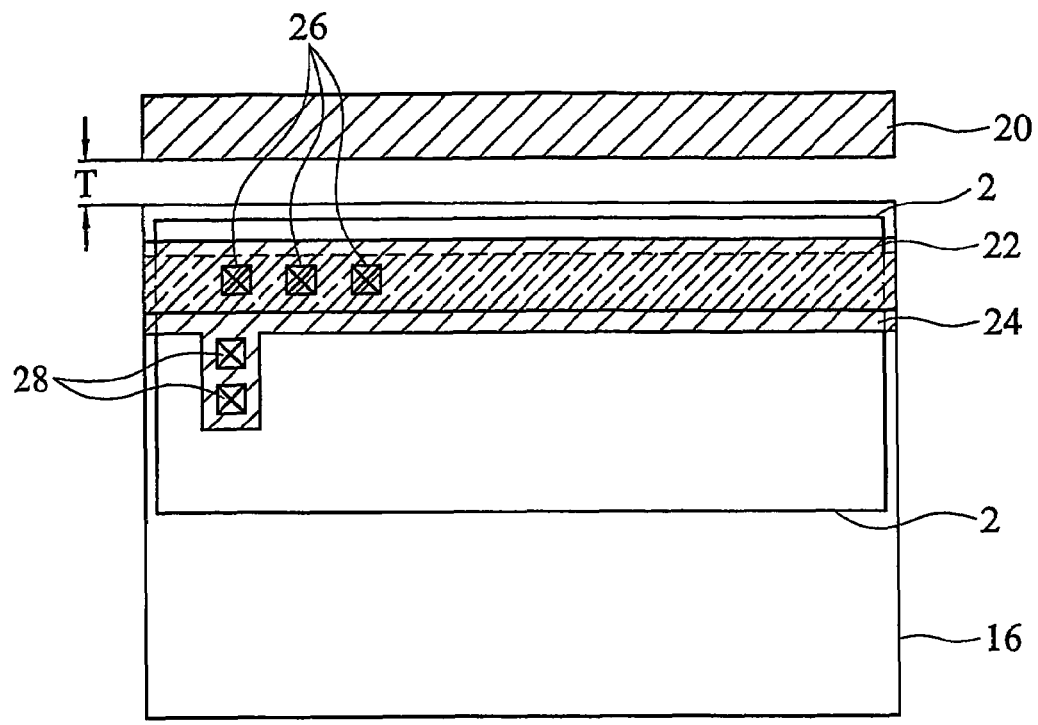
FIG. 6 illustrates another embodiment of the present invention, wherein a filler cell receives a VddH by connecting a voltage routing wire to an M2 voltage supply wire through vias.
Figure 7:
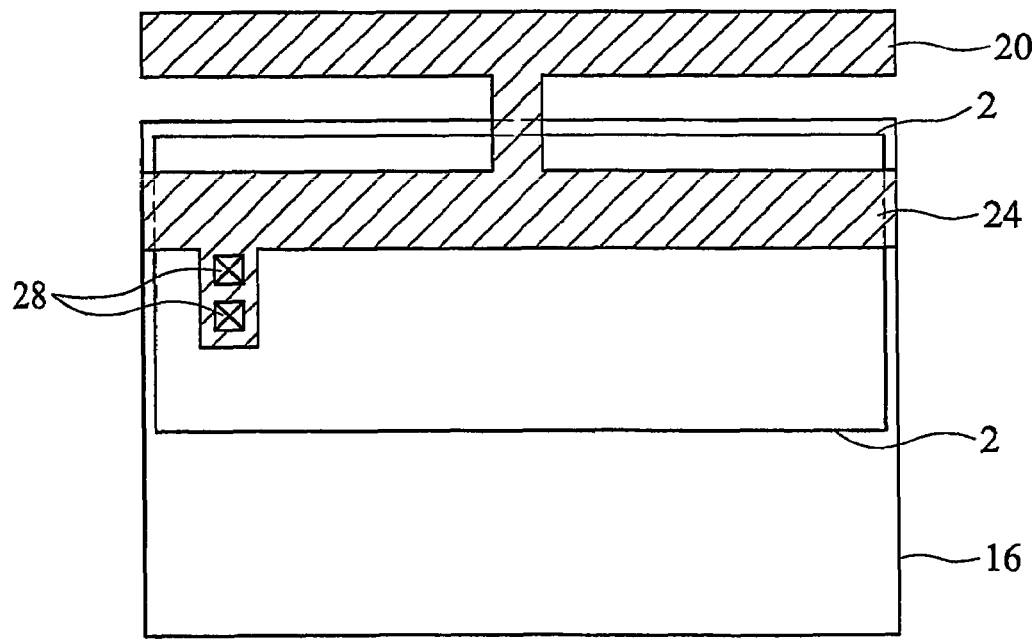
FIG. 7 illustrates a filler cell receiving a VddL by shorting a voltage routing wire to an M1 power supply wire placed outside the filler cell.
Figure 8:
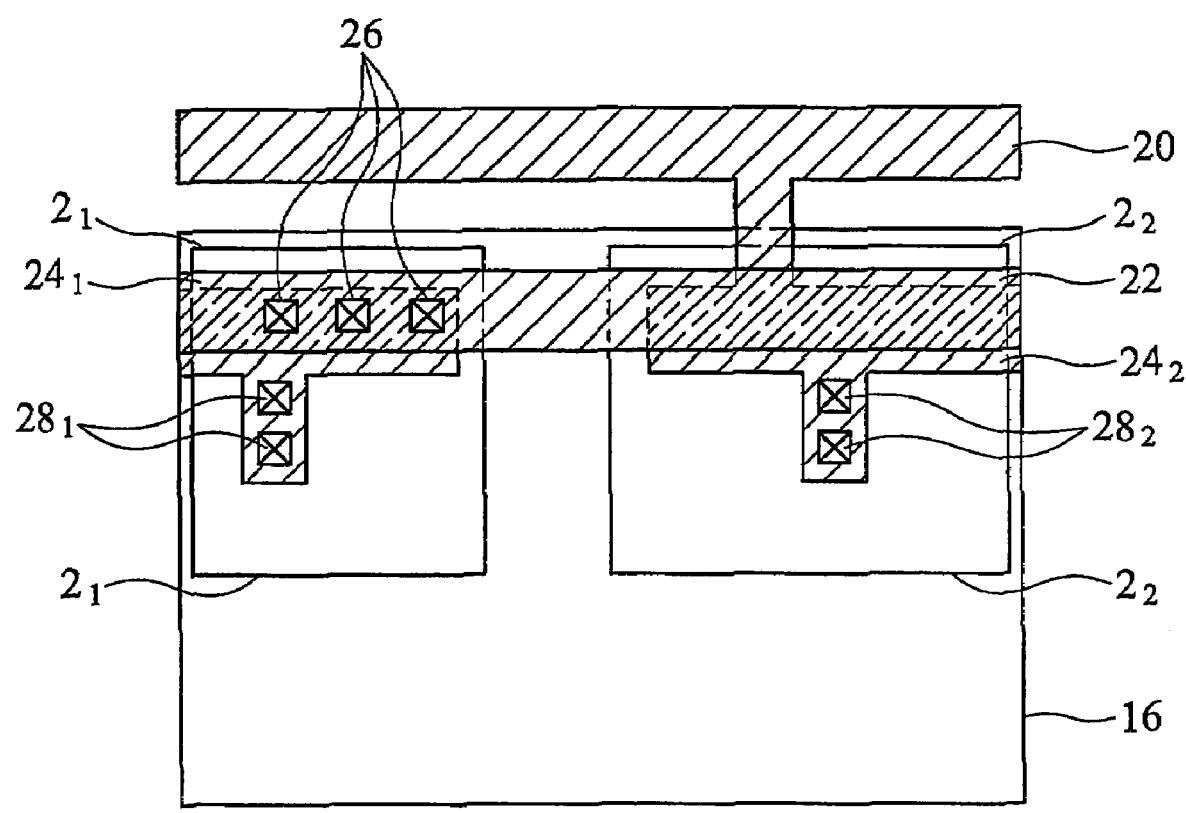
FIG. 8 illustrates an embodiment with both VddH and VddL supplied to a filler cell.

FIGS. 6 through 8 illustrate another embodiment of the present invention and its variations. In this embodiment, two voltages, a VddH and a VddL, are supplied by an M1 voltage supply wire that is laid out outside of a filler cell and an M2 voltage supply wire that is preferably laid out substantially inside the filler cell. The cell illustrated in FIG. 1 requires that a voltage supply wire be two (metal) levels above the corresponding bottom supply wire. In the preferred embodiment of the present invention, this requirement is removed. By carefully laying out other wires such as wires leading to external ports, space is available so that voltage supply wires can be laid out in M2. For simplicity purpose, the M1 voltage supply wire 20 is designated as carrying VddH, and the M2 voltage supply wire 22 is designated as carrying VddL. One skilled in the art will realize that how to designate VddH and VddL is a design decision.

FIG. 6 illustrates a filler cell 16 receiving a VddL from an M2 power supply wire 22. The M1 voltage supply wire 20 is spaced apart from the filler cell 16 by a distance T. An M1 voltage routing wire 24 connects to an M2 wire 22 through vias 26. M2 voltage supply wire 22 and M1 voltage routing wire 24 are shown slightly misaligned so that it is easy to see both. Solid lines indicate that corresponding features are at higher levels than the features having dotted lines. In actual design, they are preferably either fully aligned, or partially aligned with enough overlap for via formation. The VddL that voltage routing wire 24 receives can be supplied to the n-well 2 and devices in the n-well 2 through vias 28.

Assuming a filler cell 16 needs a VddH, the layout can be made as in FIG. 7. M1 voltage routing wire 24 is shortened with the M1 voltage supply wire 20. The n-well 2 can receive VddH through vias 28 if desired. M1 voltage supply wire 24 can route VddH to its neighboring cell on the left and/or right.

FIG. 8 illustrates an embodiment with both VddH and VddL supplied to a filler cell 16. A first voltage routing wire $24_1$ is formed above a first n-well $2_1$, a second voltage routing wire $24_2$ is formed above a second n-well $2_2$. An M2 voltage supply wire 22 extends from the left to the right of the filler cell 16 and is substantially aligned with the voltage routing wires $24_1$ and $24_2$. The voltage routing wire $24_1$ receives VddL through vias 26, and VddL can be conducted to n-well $2_1$ through vias $28_1$. The voltage routing wire $24_2$ receives VddH by being shorted with the M1 voltage supply wire 20. Similarly, n-well $2_2$ can receive VddH through vias $28_2$ if desired. VddL can be routed to cells on the left of the filler cell 16 through the voltage routing wire $24_1$. VddH can be routed to cells on the right of the filler cell 16 through the voltage routing wire $24_2$. Therefore, filler cell 16 acts as a voltage routing cell.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
    a filler cell comprising an n-well;
    a voltage routing wire in a first metal layer and within the filler cell boundary;
    a wire group comprising a first voltage supply wire carrying a first voltage and a second voltage supply wire carrying a second voltage, wherein each of the first and second voltage supply wires are formed in a respective metal layer selected from a second metal layer and a third metal layer;
    wherein the first and the second voltage supply wires are substantially parallel and have a separation distance substantially equal to the width of the voltage routing wire;
    wherein each of the first and the second voltage supply wires has an edge substantially aligned with an edge of the voltage routing wire; and
    a via connecting the voltage routing wire to one of the first and second voltage supply wires in the wire group.

2. The integrated circuit structure of claim 1 wherein substantially one half of the via vertically overlaps with the voltage routing wire and substantially one half of the via vertically overlaps with one of the first and second voltage supply wire.

3. The integrated circuit structure of claim 1 further comprising:
    an additional n-well in the filler cell;
    an additional voltage routing wire above the additional n-well, wherein the additional voltage routing wire and the voltage routing wire have a gap therebetween; and
    wherein the voltage routing wire is connected to the first voltage supply wire through the via, and the additional voltage routing wire is connected to the second supply wire through an additional via.

4. The integrated circuit structure of claim 1 further comprising a bottom via group connecting the voltage routing wire to the n-well.

5. A method of providing power supply voltages to an integrated circuit, the method comprising:
    providing a filler cell comprising an n-well;
    providing a voltage routing wire in a first metal layer;
    providing a wire group comprising a first and a second voltage supply wire, each of the first and second voltage supply wires being formed in a respective metal layer selected from the group consisting of a second metal layer and a third metal layer;
    wherein the first and the second voltage supply wires are substantially parallel and have a separation distance substantially equal to the width of the voltage routing wire;
    wherein the first and the second voltage supply wires each has an edge substantially aligned with an edge of the voltage routing wire; and
    connecting the voltage routing wire to a wire in the wire group through a via.

6. The method of claim 5 wherein substantially one half of the via vertically overlaps with the voltage routing wire and substantially one half of the via vertically overlaps with one of the first and second voltage supply wire.

7. The method of claim 5 further comprising connecting the voltage routing wire to the n-well through a bottom via.

8. The method of claim 5 further comprising:
    providing an additional n-well;
    providing an additional voltage routing wire above the additional n-well;
    connecting the voltage routing wire to the first voltage supply wire through the via; and
    connecting the additional voltage routing wire to the second voltage supply wire through an additional via.

9. An integrated circuit structure comprising:
    a filler cell comprising an n-well;
    an M1 voltage supply wire carrying a first voltage in a first metal layer and out of the filler cell;
    an M2 voltage supply wire carrying a second voltage in a second metal layer and inside the filler cell;
    a voltage routing wire in the first metal layer;
    wherein the M1 voltage supply wire and the M2 voltage supply wire are substantially parallel;
    wherein the voltage routing wire is coupled to one of the M1 voltage supply wire and the M2 voltage supply wire.

10. The integrated circuit structure of claim 9 wherein the voltage routing wire is coupled to the M1 voltage supply wire by shorting.

11. The integrated circuit structure of claim 9 wherein the voltage routing wire is coupled to the M2 voltage supply wire through a via.

12. The integrated circuit structure of claim 9 further comprising:
an additional voltage routing wire above an additional n-well;
wherein the voltage routing wire is connected to the M1 voltage supply wire through shorting and the additional M1 voltage routing wire is connected to the M2 voltage supply wire through an additional via.

13. The integrated circuit structure of claim 9 further comprising a bottom via group connecting the voltage routing wire to the n-well.

14. A method of providing voltage supply voltage to an integrated circuit, the method comprising:
providing a filler cell comprising an n-well;
providing an M1 voltage supply wire carrying a first voltage in a first metal layer, the M1 voltage supply wire being located substantially outside the filler cell boundary;
providing an M2 voltage supply wire carrying a second voltage in a second metal layer, the M2 voltage supply wire being substantially inside the filler cell boundary, wherein the M1 voltage supply wire and the M2 voltage supply wire are substantially parallel;
providing a voltage routing wire in the first metal layer and substantially inside the filler cell boundary;
coupling the M1 voltage routing wire to one of the M1 voltage supply wire and the M2 voltage supply wire.

15. The method of claim 14 wherein the voltage routing wire is coupled to the M1 voltage supply wire by shorting.

16. The method of claim 14 wherein the voltage routing wire is coupled to the M2 voltage supply wire through a via.

17. The method of claim 14 further comprising:
providing an additional n-well;
providing an additional voltage routing wire above the additional n-well, wherein the additional voltage routing wire is separated from the voltage routing wire by a separation distance;
shorting the voltage routing wire to the M1 voltage supply wire; and
connecting the additional voltage routing wire to the M2 voltage supply wire through vias.

18. The method of claim 14 further comprising a bottom via connecting the voltage routing wire to the n-well.

* * * * *